US011411081B2

(12) United States Patent
Shank et al.

(10) Patent No.: US 11,411,081 B2
(45) Date of Patent: Aug. 9, 2022

(54) FIELD EFFECT TRANSISTOR (FET) STACK AND METHODS TO FORM SAME

(71) Applicant: GLOBALFOUNDRIES U.S. Inc., Santa Clara, CA (US)

(72) Inventors: Steven M. Shank, Jericho, VT (US); Anthony K. Stamper, Burlington, VT (US); Vibhor Jain, Williston, VT (US); John J. Ellis-Monaghan, Grand Isle, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/855,236

(22) Filed: Apr. 22, 2020

(65) Prior Publication Data

US 2021/0336005 A1 Oct. 28, 2021

(51) Int. Cl.
*H01L 27/092* (2006.01)
*H01L 29/08* (2006.01)
*H01L 29/78* (2006.01)

(52) U.S. Cl.
CPC ...... *H01L 29/0847* (2013.01); *H01L 29/7835* (2013.01)

(58) Field of Classification Search
None
See application file for complete search history.

(56) References Cited

U.S. PATENT DOCUMENTS

| 5,300,448 A | 4/1994 | Merchant et al. |
| 7,964,485 B1 | 6/2011 | French et al. |
| 9,768,274 B2 | 9/2017 | Grabowski et al. |
| 10,229,932 B2 | 3/2019 | Whitefield |
| 2004/0004298 A1* | 1/2004 | Madurawe .......... H01L 27/1108 257/314 |
| 2005/0224893 A1* | 10/2005 | Arai .................. H01L 29/40114 257/E21.209 |
| 2008/0224221 A1* | 9/2008 | Yang .................. H01L 29/7833 257/365 |

(Continued)

FOREIGN PATENT DOCUMENTS

TW    202008507 A    2/2020

OTHER PUBLICATIONS

Hardikar et al., "Realizing High-Voltage Junction Isolated LDMOS Transistors With Variation in Lateral Doping," IEEE Transactions on Electron Devices, vol. 51, No. 12, Dec. 2004, 6 pages.

*Primary Examiner* — Ali Naraghi
(74) *Attorney, Agent, or Firm* — Hoffman Warnick LLC (57) ABSTRACT

The disclosure provides a field effect transistor (FET) stack with methods to form the same. The FET stack includes a first transistor over a substrate. The first transistor includes a first active semiconductor material including a first channel region between a first set of source/drain terminals, and a first gate structure over the first channel region. The first gate structure includes a first gate insulator of a first thickness above the first channel region. A second transistor is over the substrate and horizontally separated from the first transistor. A second gate structure of the second transistor may include a second gate insulator of a second thickness above a second channel region, the second thickness being greater than the first thickness. A shared gate node may be coupled to each of the first gate structure and the second gate structure.

19 Claims, 5 Drawing Sheets

(56) References Cited

U.S. PATENT DOCUMENTS

| | | | |
|---|---|---|---|
| 2011/0165767 A1* | 7/2011 | Bojarczuk, Jr. | ............................... H01L 21/823857 438/586 |
| 2014/0332806 A1 | 11/2014 | Yamazaki | |
| 2015/0243720 A1* | 8/2015 | Kwon | ................. H01L 27/1225 257/40 |
| 2020/0402577 A1* | 12/2020 | Onuki | ................. G11C 11/4076 |
| 2021/0265352 A1* | 8/2021 | Smith | ............. H01L 21/823892 |

* cited by examiner

FIELD EFFECT TRANSISTOR (FET) STACK AND METHODS TO FORM SAME

TECHNICAL FIELD

Embodiments of the disclosure relate generally to switching elements for integrated circuits (ICs). More specifically, embodiments of the disclosure provide a field effect transistor (FET) stack and methods to form the same.

BACKGROUND

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a semiconductor body and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

In radio frequency (RF) circuitry and similar applications, a circuit design often includes substantial power amplification elements to perform various functions. In the example of RF technology, signal transmission may require signal amplification at a high voltage level, e.g., forty volts or more in some applications. In such devices, a single transistor may be ineffective for controlling the flow of current from one node to another. To accommodate high voltage and power requirements, stacks of FETs (i.e., several transistors coupled together at their source/drain terminals) are often deployed in a series combination. The multiple transistors may be structured to act as a single switch between two high voltage nodes of a circuit. During operation, however, the FETs in the stack often exhibit an asymmetrical voltage distribution across their source and drain terminals. In some cases, the asymmetrical voltage may cause premature breakdown of FETs that are located closest to the output signal, i.e., where the voltage drop from source to drain is likely to be highest. Conventional approaches to mitigate this problem may rely on using a stack of FETs with higher breakdown voltage levels. However, such designs often exhibit higher resistance when turned on, and/or higher capacitance when turned off, and thus create other technical obstacles.

SUMMARY

Aspects of the present disclosure provide a field effect transistor (FET) stack, including: a first transistor over a substrate, the first transistor including: a first active semiconductor material including a first channel region between a first set of source/drain terminals, and a first gate structure over the first channel region, wherein the first gate structure includes a first gate insulator of a first thickness above the first channel region; a second transistor over the substrate and horizontally separated from the first transistor, the second transistor including: a second active semiconductor material including a second channel region between a second set of source/drain terminals, wherein a selected one of the set of second source/drain terminals is coupled to a selected one of the first set of source/drain terminals of the first transistor, and a second gate structure over the second channel region, wherein the second gate structure includes a second gate insulator of a second thickness above the second channel region, the second thickness being greater than the first thickness; and a shared gate node coupled to each of the first gate structure and the second gate structure.

Further aspects of the present disclosure provide a field effect transistor (FET) stack, including: a first transistor over a substrate, including: a first active semiconductor material having a first conductive dopant concentration and including a first channel region between a first set of source/drain terminals, and a first gate structure over the first channel region; a second transistor over the substrate and horizontally separated from the first transistor, the second transistor including: a second active semiconductor material having a second conductive dopant concentration and including a second channel region between a second set of source/drain terminals, wherein the second conductive dopant concentration is greater than the first conductive dopant concentration, and a selected one of the set of second source/drain terminals is coupled to a selected one of the first set of source/drain terminals of the first transistor, and a second gate structure over the second channel region; and a shared gate node coupled to each of the first gate structure and the second gate structure.

Further aspects of the present disclosure provide a method to form a field effect transistor (FET) stack for an integrated circuit, the method including: forming a first semiconductor well and a second semiconductor well over a substrate, wherein the first semiconductor well is horizontally separated from the second semiconductor well; introducing a dopant within the first semiconductor well and the second semiconductor well to yield a first active semiconductor material and a second active semiconductor material, such that the first active semiconductor material has a first dopant concentration that is different from a second dopant concentration of the second semiconductor well; electrically coupling a first source/drain terminal of the first active semiconductor material to a second source/drain terminal of the second active semiconductor material; forming a plurality of gate structures including a first gate structure on a first channel region of the first active semiconductor material and a second gate structure on a second channel region of the second active semiconductor material, wherein a threshold voltage of the second gate structure over the second active semiconductor material is greater than a threshold voltage of the first gate structure over the first active semiconductor material; and electrically coupling each of the first gate structure and the second gate structure to a shared gate node.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a field effect transistor (FET) stack and methods to form the same. According to embodiments, a first transistor may be over a substrate and may include a first active semiconductor material including a first channel region between a first set of source/drain terminals. A first gate structure may be over the first channel region. A second transistor may be over the substrate and horizontally separated from the first transistor. The second transistor may include a second active semiconductor material with a second channel region between a second set of source/drain terminals. One of the second set of source/drain terminals may be coupled to one of the first set of source/drain terminals, e.g., directly or through one or more additional transistors therebetween. The first transistor and second transistor each may be coupled to a shared gate node through their respective gate structures. The second transistor may have a greater threshold voltage (i.e., the minimum voltage to form a conductive pathway from source to drain through a channel region) than the first transistor. The threshold voltage of the second transistor may arise from having a thicker gate insulator than the first transistor and/or by having a channel region with a greater conductive dopant concentration than the channel region of the first transistor. Embodiments of the disclosure also provide a method to form a FET stack with these characteristics.

Figure 1:
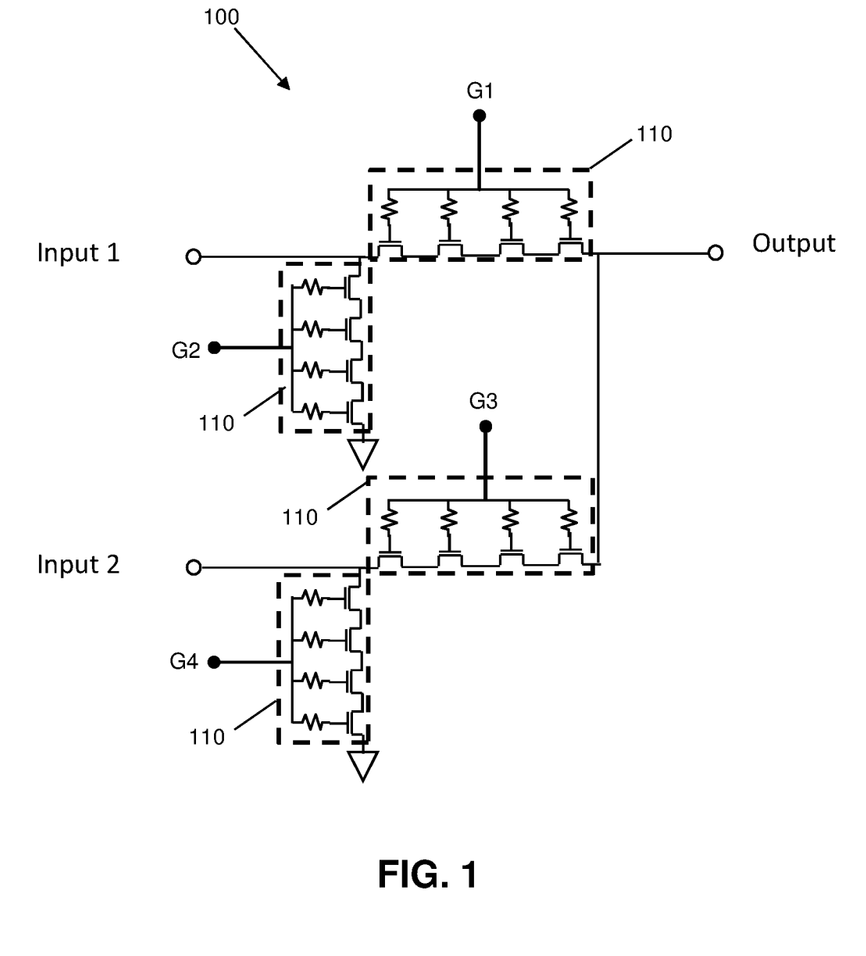
FIG. 1 shows a schematic view of a circuit structure with field effect transistor (FET) stacks according to embodiments of the disclosure.

Referring to FIG. 1, a schematic view of an integrated circuit (IC) structure (simply "structure" hereafter) 100 according to embodiments of the disclosure is shown. Structure 100 may represent an electrical switch within a portion of an RF device and/or other electrical circuit for connecting one or more inputs to an output. In the example of FIG. 1, structure 100 selects between one of two inputs ("input 1" and "input 2," respectively) to be transmitted to an output node ("output"), e.g., for transmission, amplification, etc., as an RF signal. During operation, structure 100 may select input 1 or input 2 for transmission to the output by way of several FET stacks 110.

Each FET stack 110 may be coupled to a shared gate (each labeled G1, G2, G3, G4) for controlling whether current may pass through the source/drain terminals of a respective FET stack 110. When gate nodes G1, G4 are set to at least a threshold voltage while gate nodes G2, G3 are not set to at least the threshold voltage, current from input 1 may pass through FET stack 110 of node G1 to the output. In this state, current from input 2 is shunted to another node (i.e., deliberately shorted to another portion of the device) through FET stack 110 of node G4. When gate nodes G2, G3 are set to at least a threshold voltage while gate nodes G1, G4 are not set to at least the threshold voltage, current from input 2 may pass through FET stack 110 of node G3 to the output. In this case, current from input 1 is shunted to another node through FET stack 110 of node G2.

FET stacks 110 controlled by gate nodes G1, G3 may be known as "series FET stacks" while FET stacks 110 controlled by gate nodes G2, G4 may be known as "shunt FET stacks," based on their operational purposes. It is understood that embodiments of the disclosure may be implemented in the structure and forming of any FET stack 110 within structure 100, and/or other FET stacks 110 for other structures. Due to the presence of multiple transistors in each FET stack 110, embodiments of the disclosure provide a structure and method to vary the threshold voltage across FET stacks 110 during manufacture, such that transistors located closer to the output have a different threshold voltage than transistors located closer to a respective input node.

Embodiments of the disclosure provide a method to form a FET stack (e.g., one or more of FET stacks 110 of structure 100) in which different transistors have different threshold voltages. According to an example, embodiments of the disclosure may cause the threshold voltage of each successive transistor in a FET stack to increase as the conductive pathway moves from an input to an output. The threshold voltage may increase from transistor to transistor according to a predetermined voltage profile (e.g., from lowest threshold voltage to highest threshold voltage) in a linear, exponential, piecewise-defined and/or other desired pattern. As the threshold voltage of a transistor increases, it more easily accommodates higher levels of source-drain voltage (Vds) and thus may accommodate higher amounts of power before breaking down. Embodiments of the disclosure thus vary the maximum power (P max) for each transistor within a single FET stack.

Figure 2:
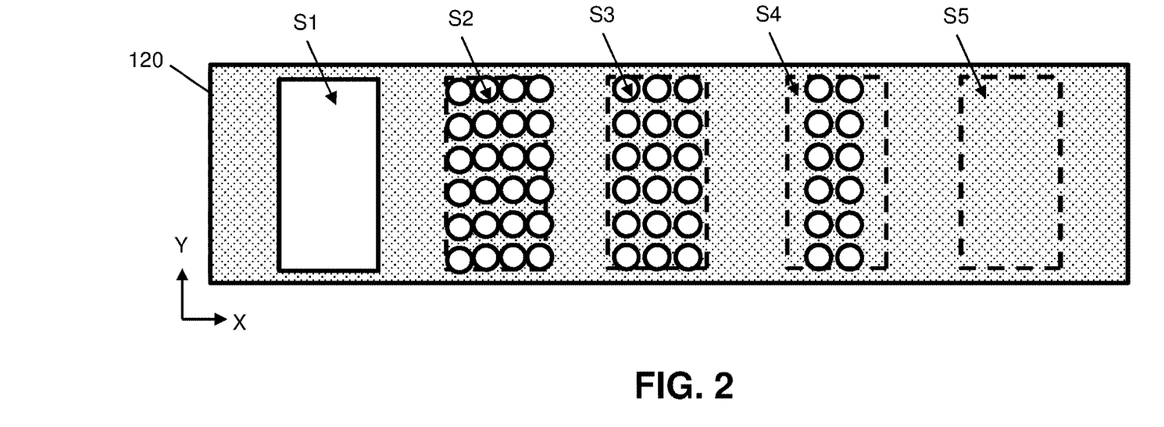
FIG. 2 shows a plan view in plane X-Y of a photoresist layer for forming a FET stack according to embodiments of the disclosure.
Figure 3:
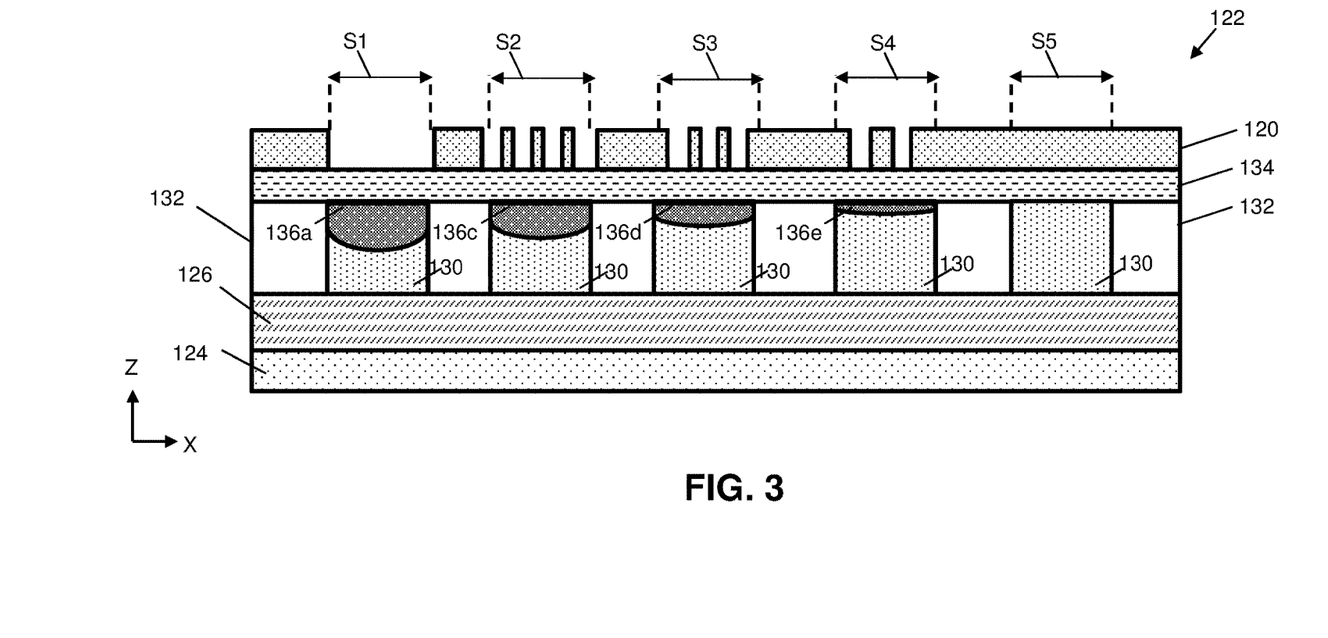
FIG. 3 shows a cross-sectional view in plane X-Z of a precursor structure and photoresist layer for forming a FET stack according to embodiments of the disclosure.

FIGS. 2 and 3, represent methods of forming FET stack(s) 110 (FIG. 1) according to embodiments of the disclosure. FIG. 2 depicts a photoresist layer 120 while FIG. 3 illustrates a preliminary structure 122 as it is processed with photoresist layer 120 in place. Through one or more methods described herein, preliminary structure 122 can be processed with photoresist layer 120 to form FET stack(s) 110. Preliminary structure 122 includes a substrate 124 (FIG. 3 only). Substrate 124 may include any now known or later developed form of semiconductor substrate used to create an active region for a transistor device. For example, substrate 124 may include a bulk substrate, a fin, a nanowire, etc. For purposes of description, substrate 124 may be a semiconductor fin. Substrate 124 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entire substrate 124 may be strained. FIG. 3 depicts preliminary structure 122 in which one or more gate structures are formed over substrate 124, but it is understood that preliminary structure 122 may include one or more gate structures, as described elsewhere herein, in further embodiments.

Preliminary structure 122 in some cases may include a buried insulator layer 126 (also known as a "buried oxide" or "BOX" layer) on substrate 124 to vertically and electrically separate overlying materials from substrate 124. Buried insulator layer 126 may be formed, e.g., by deposition on substrate 124. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Other portions of preliminary structure 122 may be formed by subsequent deposition, and/or targeting and removing (e.g., by selective etch) portions of buried insulator layer 126 and forming other materials in place of the removed insulator. Buried insulator layer 126 is formed of an insulating material, e.g., a dielectric. Some dielectrics commonly used in semiconductor technology are $SiO_2$ ("oxide") and $Si_3N_4$ ("nitride"). The insulating quality of a dielectric may be characterized by "k", the dielectric constant. Generally, the higher the "k", the better the insulating quality of the dielectric. Oxide, for example, has a k of approximately 3.9. A class of materials, referred to as "high-k" (or "high-K") dielectrics, have a dielectric constant higher than that of oxide (k>3.9).

Preliminary structure 122 may include a layer of doped semiconductor and insulative materials on buried insulator layer 126 to define active and non-active regions for several transistors. Preliminary structure 122 may include multiple semiconductor wells 130 (FIG. 3) separated from each other and/or laterally distal components by a corresponding set of trench isolations 132 (FIG. 3) horizontally between semiconductor wells 130. Trench isolations 132 may include one or more of the example insulative materials discussed herein with respect to buried insulator layer 126, and/or any other currently known or later developed insulative material. Each semiconductor well 130 may include one or more semiconductor materials, including those described herein with respect to substrate 124 and/or other semiconductor materials. Each semiconductor well 130 in some cases may include one or more dopants. The dopants within semiconductor wells 130 may be previously introduced within the semiconductor material before manufacturing occurs, and/or may be introduced by other techniques, e.g., implanting. Semiconductor wells 130 may be capable of receiving additional dopants to further control the properties of FET stack 110.

Semiconductor wells 130 and buried insulator layer 126 may be sized such that buried insulator layer 126 create a capacitive coupling between substrate 124 and semiconductor well(s) 130. The source-drain voltage (Vds) for each transistor in FET stack 110 may vary from end-to-end as a result of the capacitive coupling, as current flows through FET stack 110 from an input to an output. Embodiments of the disclosure account for variations of the source-drain voltage (Vds) for each transistor by structurally varying each transistor's threshold voltage. More specifically, transistors located closer to the output node may have higher threshold voltages, and thus higher maximum power (P max) limits, than transistors that are located closer to the input node.

Methods according to the disclosure may include forming a screen oxide 134 (FIG. 3) on the upper surfaces of semiconductor wells 130 and trench isolations 132. Screen oxide 134 may be formed on semiconductor wells 130 and trench isolations 132, and may be formed of one or more oxide materials which protect the underlying materials during subsequent implantation of dopants into semiconductor wells 130. Screen oxide 134 may include, e.g., a silicon oxide compound (e.g. $SiO_2$), and/or other material that is permeable to selected ions. Screen oxide 134 may be formed to any desired thickness, and in one implementation may have a thickness of approximately ten nanometers (nm).

Continued processing may include forming photoresist layer 120 on preliminary structure 122. Photoresist layer 120 may take the form of, e.g., a radiation sensitive "resist"

coating formed over preliminary structure 122. Photoresist layer 120 may include, e.g., tetraethyl orthosilicate (TEOS) and/or other materials which may be conformally deposited onto semiconductor wells 130 and trench isolations 132. Photoresist layer 120, is itself first patterned by exposing it to radiation, where the radiation (selectively) passes through an intervening mask or template containing the pattern. As a result, the exposed or unexposed areas of photoresist layer 120 become more or less soluble, depending on the type of photoresist used. A developer is then used to remove the more soluble areas of the resist leaving a patterned resist. The patterned resist can then serve as a mask for the underlying layers (e.g., semiconductor wells 130) which can then be selectively treated, such as to receive ions for doping as discussed herein.

Some embodiments of FET stack 110 may provide a different threshold voltage at each of its transistors by varying the gate oxide thickness. To provide this feature, different amounts of dopant material may be formed in each semiconductor well 130 to control the overlying gate dielectric thickness. Photoresist layer 120 may be structured to provide different amounts of doping in each semiconductor well 130 of preliminary structure 122. FIG. 2 depicts an example in which photoresist layer 120 includes five targeted regions S1, S2, S3, S4, S5, each of which may have different amounts of vacant space within their respective surface areas. The surface area occupied by openings within each region S1, S2, S3, S4, S5 may correspond to the desired doping level of semiconductor wells 130 thereunder. Photoresist layer 120 may be structured for introducing different amounts of dopants into different regions of preliminary structure 122. In one example, the dopants may be introduced to impede subsequent deposition of gate insulator materials. Such dopants may include, e.g., nitrogen ($N_2$) ions and/or other materials which impede the growth or deposition of insulative materials thereon. In alternative examples discussed elsewhere herein, photoresist layer 120 may be used for introducing conductive dopants into preliminary structure 122, with or without structural modifications.

First region S1 of photoresist layer 120 may include the largest vacant surface area, and thus may allow a larger number of implanted ions to reach its underlying semiconductor well 130. Second region S2 of photoresist layer 120 may have a predetermined amount of vacant surface area less than that of first region S1, but also allows implanted ions to reach its underlying semiconductor well 130. Third region S3 of photoresist layer 120 may have a smaller amount of vacant surface area than second region S2, and thus may allow fewer ions to be implanted within its underlying semiconductor well 130. Fourth region S4 of photoresist layer 120 may include an even smaller amount of vacant surface area than first region S1, second region S2, and third region S3, and thus allow a further reduced dopant concentration to be formed within the underlying semiconductor well 130. Fifth region S5 of photoresist layer 120 may not include any openings, and thus may not allow any of the implanted ions to reach its underlying semiconductor well 130. Although FIG. 2 provides an example of increasing the vacant surface area by varying the number and/or size of openings through photoresist layer 120, the vacant surface area in each region S1, S2, S3, S4, S5 may be provided by any currently known or later developed structural configuration.

In the example shown, implanted dopants can pass most easily through first region S1 of photoresist layer 120 but are blocked from passing through fifth region S5. FIG. 3 depicts preliminary structure 122 as dopants are introduced into semiconductor wells 130 with photoresist layer 120 in place. Semiconductor well 130 beneath fifth region S5 of photoresist may be substantially free of dopants. Semiconductor well 130 beneath region S1 may include a doped region 136a that is larger than other doped regions 136c, 136d, 136e formed within other semiconductor wells 130, i.e., deeper and/or higher dopant concentration. The different dopant concentrations in each region 136a, 136b, 136c, 136d, 136e may arise from using photoresist layer 120 to implant different dopant concentrations into semiconductor wells 130 over one substrate 124. In subsequent processing, the size of doped regions 136c, 136d, 136e will affect the size of overlying gate dielectric materials. Higher dopant concentrations will cause overlying gate dielectric layers to be thinner than gate dielectric layers formed on semiconductor wells 130 without dopants, or with lower dopant concentrations.

Figure 4:
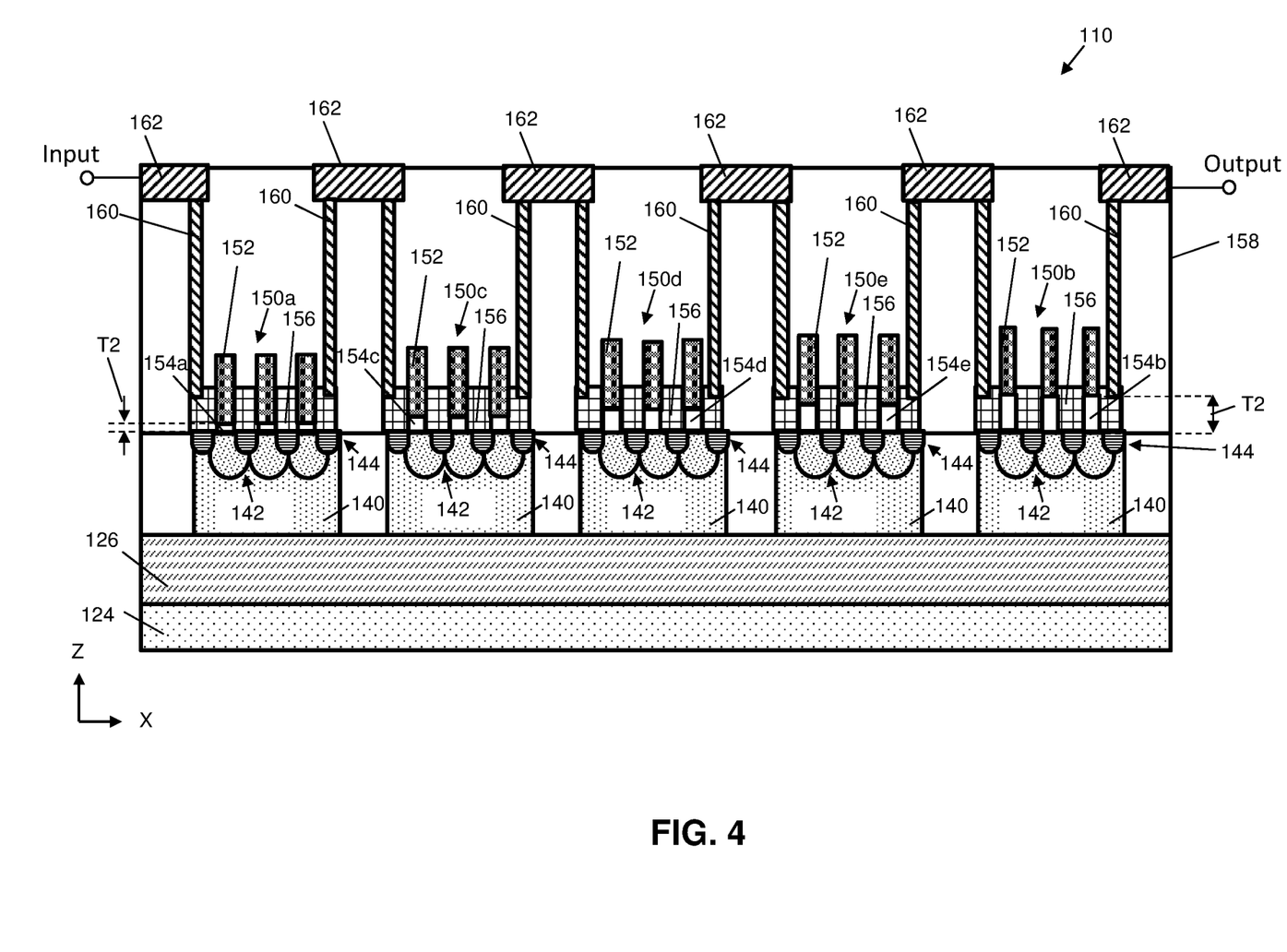
FIG. 4 shows a cross-sectional view in plane X-Z of a FET stack according to embodiments of the disclosure.

FIG. 4 depicts a cross-sectional view in plane X-Y of FET stack 110 after ions are introduced into semiconductor wells 130 (FIG. 3), and photoresist layer 120 (FIGS. 2, 3) and screen oxide 134 (FIG. 3) are removed. In the FIG. 4 view, semiconductor well(s) 130 with doped region 136 therein are identified as an active semiconductor material 140 and depicted with a single type of cross-hatching for clarity of illustration. Continued processing to form FET stack may include introducing additional dopants into targeted portions of active semiconductor material 140 to form the source and drain regions of eventual transistors. The previously-doped portions of active semiconductor material 140 may form channel regions 142 of active semiconductor material 140.

Further processing may include implanting active semiconductor material 140 with one or more dopants, e.g., through the upper surface thereof, to form pairs of source/drain regions 144. The implanting may include one or more implanting processes, e.g., ion implanting, to form the illustrated structure. Active semiconductor material 140 can be doped in multiple phases, e.g., by lightly doping the semiconductor material in a first phase to form channel region 142, and more heavily doping active semiconductor material 140 with a different mask to form source/drain terminals at targeted locations. Depending on the polarity of the device being formed, e.g., NFET or PFET, the dopant may vary. For purposes of description, the dopants used to form source/drain regions 144 may be phosphorous (P) for an NFET device. According to an example, each region of semiconductor material may include several channel regions 142 interdigitated with several source/drain regions 144, but a single channel region 142 and pair of source/drain regions 144 may be formed in alternative implementations.

Each region of active semiconductor material 140 over substrate 124 may be the foundation for a respective transistor of FET stack 110. In an example, FET stack 110 may include a first transistor 150a and a second transistor 150b over substrate 124. First transistor 150a may be coupled to second transistor 150b through one or more additional transistors (e.g., a third transistor 150c, a fourth transistor 150d, a fifth transistor 150e, etc.), or directly in further embodiments. In any case, trench isolations 132 may horizontally separate each transistor 150a, 150b, 150c, 150d, 150e from each other.

FIG. 4 also shows a set of gate structures 152 for each transistor 150a, 150b, 150c, 150d, 150e over active semiconductor material 140. Gate structures 152 may include any now known or later developed gate structure. Gate spacers (not shown) may be located on the sides of each gate structure, and may include any now known or later developed gate spacer material such as silicon nitride. It will be recognized that gate structures 152 take a number of other forms where the RMG process is not employed such as but not limited to metal gates (i.e., in a gate first process). Regardless of gate structure formation process, gate structures 152 may be formed using any now known or later developed gate formation techniques. Conductive contacts (not shown) may be formed to gate structure(s) 152 at locations that are horizontally distal to the X-Y cross-section shown in FIG. 4. Such contacts thus may be located forward of, or behind, the plane of the page and are capable of applying a voltage to gate structure(s) 152 to control the conductivity through channel region(s) 142. Each gate structure 152 in FET stack 110, in some implementations, may have approximately equal gate lengths along the X-axis. In such cases, the thickness of an underlying gate insulator 154 may be the sole identifiable difference between gate structures 152 of each transistor 150a, 150b, 150c, 150d, 150e in FET stack 110.

Each gate structure 152 may include a layer of gate insulator 154 directly on an upper surface of channel region 142. The gate insulator materials for each transistor 150a, 150b, 150c, 150d, 150e are identified separately as gate insulators 154a, 154b, 154c, 154d, 154e. Gate insulator 154 may be formed by depositing one or more insulative materials on channel region 142 and not on source/drain regions 144. Gate insulator 154 may include substances such as, e.g., hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. Embodiments of FET stack 110 differ from conventional switching structures by varying the thickness of gate insulator 154 over channel region(s) 142.

Instead of forming gate insulator material to a uniform thickness over active semiconductor material 140, each gate insulator 154a, 154b, 154c, 154d, 154e may have a distinct thickness. The varying thicknesses of each gate insulator 154a, 154b, 154c, 154d, 154e may arise from the previous doping of active semiconductor material 140 with dopants that impede the deposition or growth of oxide materials (e.g., the example of N$_2$ ions discussed elsewhere herein). The varying dopant concentrations may allow gate insulators 154 to be formed with varying thickness in a single instance of deposition of insulating material. First transistor 150a may be formed on active semiconductor material 140 with the highest N$_2$ (or other oxide inhibiting dopant) concentration, and second transistor 150b may be formed on active semiconductor material 140 with the lowest N$_2$ (or other oxide inhibiting dopant) concentration. A first thickness T1 of gate insulator 154a is much smaller than a second thickness of gate insulator 154b. The different thicknesses arise from different amounts of doping within the underlying active semiconductor material 140. Gate insulators 154c, 154d, 154e between gate insulators 154a, 154b may have distinct thicknesses that are greater than first thickness T1 but less than second thickness T2.

According to an example, the thickness of each laterally adjacent gate insulator 154 may increase from left-to-right along the X-axis in proportion with the doping concentration of active semiconductor material 140. As shown, transistor 150d positioned electrically midway between first transistor 150a and second transistor 150b may have a thickness that is greater than first thickness T1 and less than second thickness T2. In this case, the difference between first thickness T1 and transistor 150d may be approximately equal to the difference between second thickness T2 and transistor 150D. The distinct thickness of each gate insulator 154a, 154b, 154c, 154d, 154e will cause each transistor 150a, 150b, 150c, 150d, 150e to have a distinct threshold voltage. More specifically, thickness T1 may be sized such that the threshold voltage of first transistor 150a is significantly less than a threshold voltage of second transistor 150b. Where applicable, the threshold voltage of first transistor 150a may also be less than other transistors 150c, 150d, 150e in FET stack 110, while the threshold voltage of second transistor 150b may be greater than all other transistors 150a, 150c, 150d, 150e of FET stack 110.

Each transistor 150a, 150b, 150c, 150d, 150e of FET stack 110 may include a set of source/drain terminals 156, each positioned on an underlying source/drain region 144. Source/drain terminals 156 may be formed by depositing one or more conductive metals on source/drain regions 144, and horizontally alongside gate structure(s) 152. Additional conductive materials may be formed to selected source/drain regions 144 to interconnect each transistor 150a, 150b, 150c, 150d, 150e, as discussed herein. As shown, source/drain terminals 144 may be raised above the surface of active semiconductor material 140 and positioned directly alongside gate structure(s) 152.

FIG. 4 also shows an interlayer dielectric (ILD) 158 over transistors 150a, 150b, 150c, 150d, 150e. ILD 158 may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

FET stack 110 may include contacts 160 to selected source/drain terminals 156. Contacts 160 may be formed using any now known or later developed technique, e.g., patterning a mask (not shown), etching to create contact openings in ILD 158, and depositing a refractory metal liner and contact conductor, and planarizing. Further processing may include forming conductive wires 162 on one or more contacts 160. Conductive wires 162 may include the same material as contacts 160 and/or other conductive materials. Conductive wires 162 may electrically couple two transistors 150 of FET stack 110 to each other, or may electrically couple one or more transistors 150 to other device components. In one example, one conductive wire 162 may electrically couple first transistor 150a to an input node, while another conductive wire 162 may electrically couple second transistor 150b to an output node. Each gate structure 152, however, of FET stack 110 similarly may be coupled to one shared gate node (e.g., one of node G1, G2, G3, G4 shown in FIG. 1) through one or more contacts and metal wires, e.g., in the configuration shown in FIG. 1. Such contacts and metal wires are not visible in FIG. 4 because they are located in front of, or behind, the plane of the page yet still in communication with gate structures 152. One shared gate node may be coupled to each gate structure 152, such that the same gate node voltage is applied to all transistors 150a, 150b, 150c, 150d, 150e simultaneously. During operation as part of a high voltage device (e.g., an RF switching circuit), FET stack 110 may be implemented as a series FET stack for coupling an input node to an output node (e.g., FET stacks 110 coupled to gate nodes G1, G3 of FIG. 1), or alternatively, as a shunt FET stack for deliberately shorting a signal from the input node to another node (e.g., FET stacks 110 coupled to gate nodes G2, G4 of FIG. 1).

Figure 5:
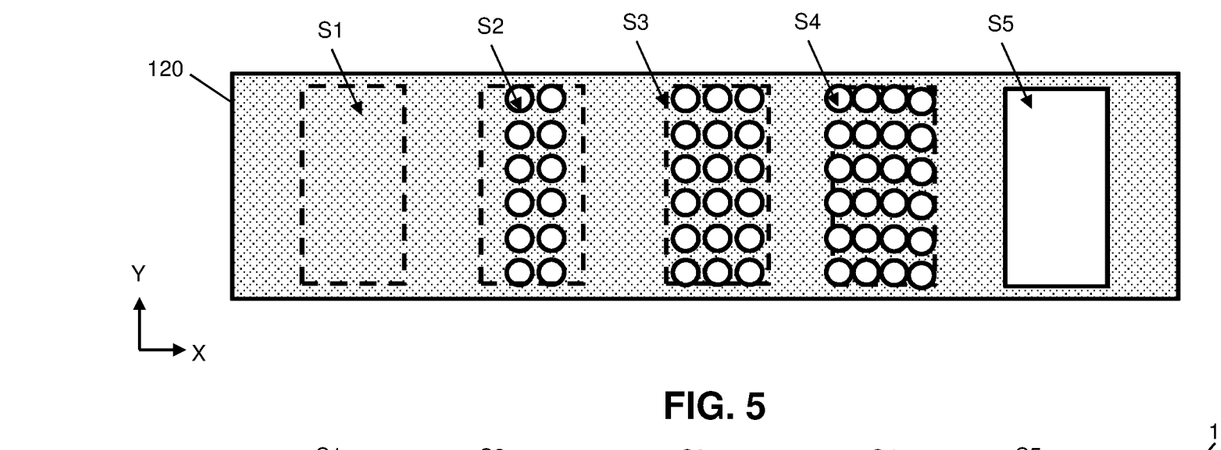
FIG. 5 shows a plan view in plane X-Y of a photoresist layer for forming a FET stack according to further embodiments of the disclosure.
Figure 6:
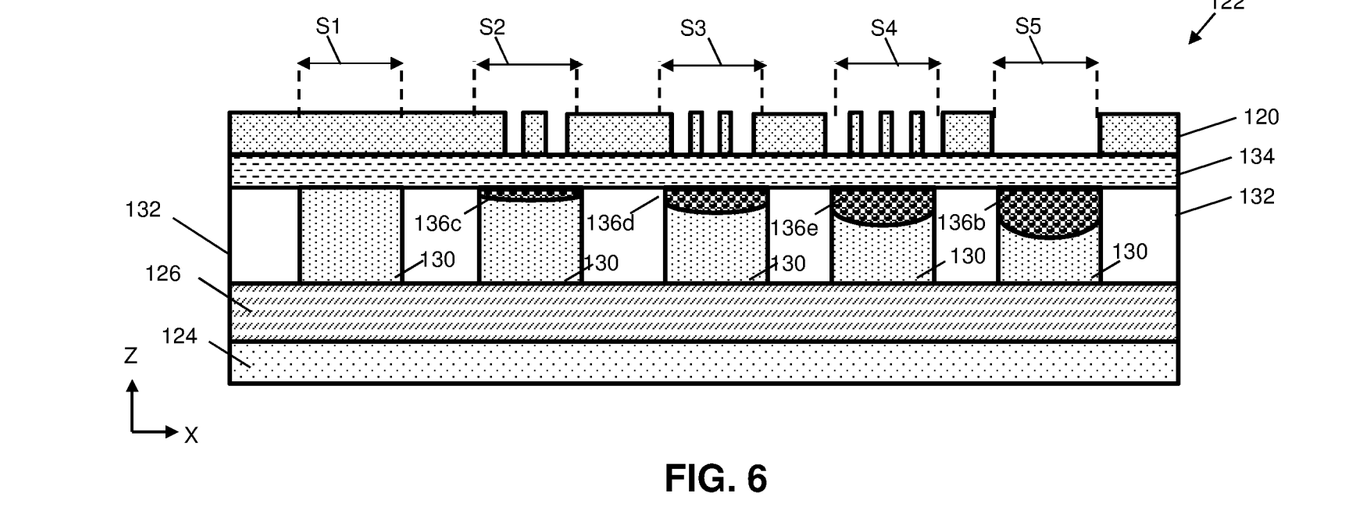
FIG. 6 shows a cross-sectional view in plane X-Z of a precursor structure and photoresist layer for forming a FET stack according to further embodiments of the disclosure.

Referring now to FIGS. 5 and 6 together, further embodiments of FET stack 110 (FIGS. 1, 3) may vary the threshold voltage of transistors therein by using different amounts of conductive dopants in the channel region of each transistor 150 (FIG. 4). In this example, the thickness of gate insulator 154 (FIG. 4) may be approximately uniform for each transistor 150. To provide varying amounts of conductive dopants within each channel region 142, different manufacturing processes and/or different materials may be used at selected stages of manufacturing. FET stack 110 otherwise may be similar or identical in its structure to other examples described herein. Thus, the various components, processes, and/or other features described herein with respect to FIGS. 1-4 may be implemented in all embodiments of the disclosure without significant changes, except where noted herein.

It is possible to vary the threshold voltage of each transistor in FET stack 110 (FIGS. 1, 4) by introducing different amounts of conductive dopants into each semiconductor well 130. Such an implementation differs from introducing dopants into semiconductor wells 130 which only modify the thickness of overlying gate insulator 154 (FIG. 4) material in subsequent processing. To vary the conductive dopant concentrations, photoresist layer(s) 120 used to doped semiconductor well(s) 130 (FIG. 6) may include multiple regions S1, S2, S3, S4, S5 but in a different orientation compared to other examples discussed herein. For instance, first region S1 may have the least amount of vacant surface area (or none) to prevent, or otherwise limit, the passage of dopants through first region S1. Fifth region S5 may have the largest amount of vacant surface area, thereby allowing more dopants to pass through fifth region S5 than through other regions S1, S2, S3, S4 of photoresist layer 120.

The alternative form of photoresist layer 120 and its corresponding regions S1, S2, S3, S4, S5 may allow the left-most semiconductor well 130 on X-axis to receive the lowest dopant concentration (or no dopant materials altogether), while the rightmost semiconductor well 130 on X-axis receives the highest dopant concentration. The conductive dopant materials introduced to semiconductor well 130 through photoresist layer 120 may include, e.g., boron (B), arsenic (As), or similar materials. Here, the dopant concentration within doped region 136b of semiconductor well 130 may be greater than in other doped regions 136c, 136d, 136e of preliminary structure 122. The total doping concentration may increase from left-to-right along X-axis according to any desired profile, e.g., a linear profile, exponential profile, piecewise-defined profile, etc.

Figure 7:
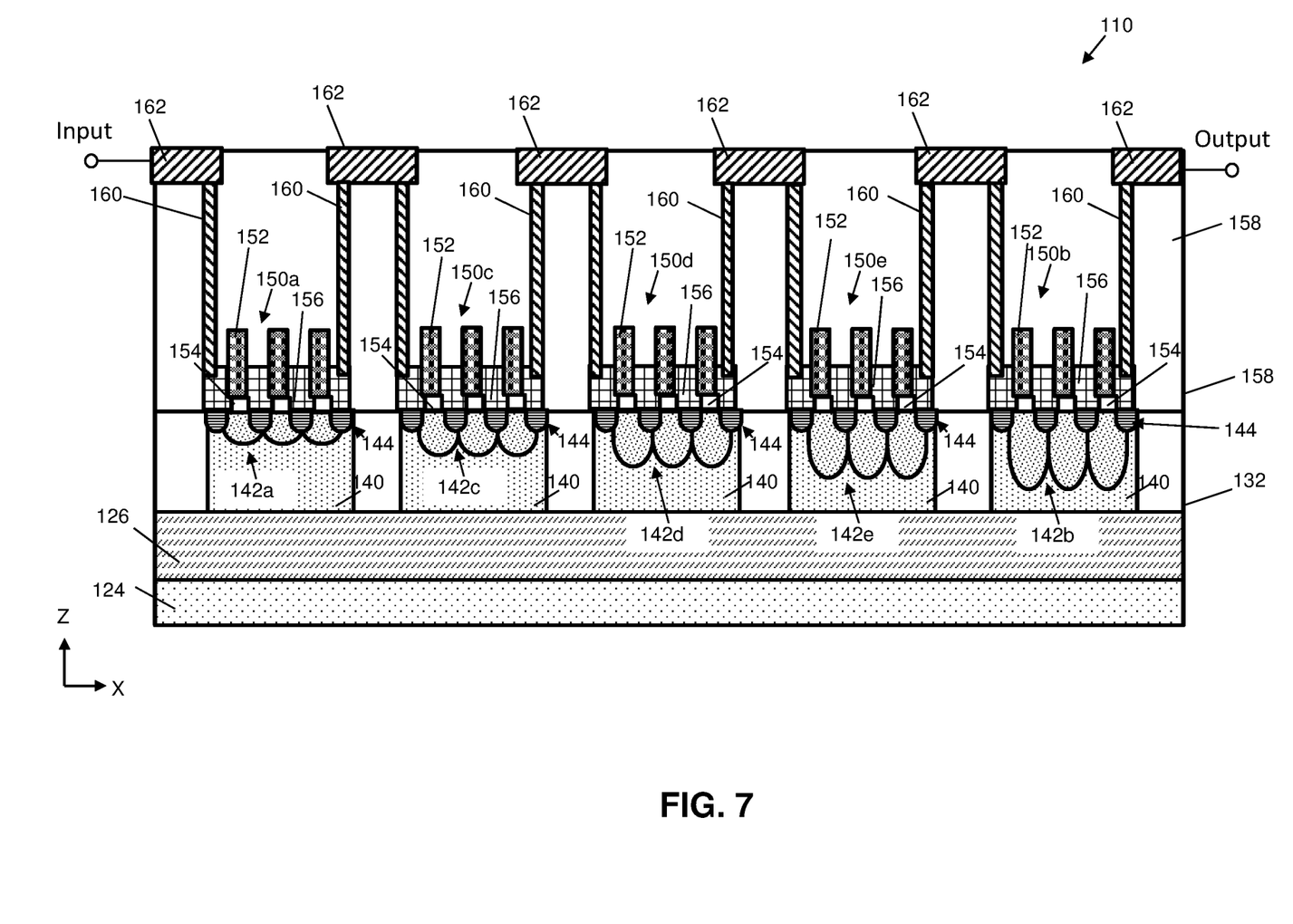
FIG. 7 shows a cross-sectional view in plane X-Z of a FET stack according to further embodiments of the disclosure.

Referring now to FIG. 7, continued processing to form FET stack 110 (e.g., forming of channel regions 142, source/drain regions 144, gate structures 152, contacts 160, conductive wires 162, etc.) may continue in substantially the same manner as other embodiments. In this case, however, each gate insulator 154 may be of substantially uniform thickness due to the absence of dopants within active semiconductor material 140 selected for limiting oxide deposition or growth. However, the prior introduction of conductive dopants into semiconductor well 130 (FIG. 6) may cause each transistor 150a, 150b, 150c, 150d, 150e to have different doping concentrations in each respective channel region 142a, 142b, 142c, 142d, 142e. In FIG. 7, differences in the size of each channel region 142a, 142b, 142c, 142d, 142e may represent distinct doping concentrations as well as the depth of doping within active semiconductor material 140. According to one example, first transistor 150a may have first channel region 142a with a substantially lower dopant concentration than second channel region 142b for second transistor 150b. The lower doping concentration of first channel region 142a may be caused by the previous introduction of conductive dopants into semiconductor well 130 before forming the remainder of FET stack 110. Transistors 150 with larger channel regions 142 may exhibit larger source-drain voltages to achieve channel carrier inversion, and thus may have a higher threshold voltage than transistors 150 with smaller channel regions 142.

Apart from the differences in doping concentration between channel regions 142a, 142b, 142c, 142d, 142e, embodiments of FET stack 110 may be structurally similar and/or operationally identical to other embodiments of FET stack 110. FET stack 110 thus may include additional transistors 150c, 150d, 150e electrically coupled between first transistor 150a and second transistor 150b, including channel regions 142c, 142d, 142e that have higher doping concentrations than first channel region 142a but lower doping concentrations than second channel region 142b. According to a further example, each successive channel region 142a, 142b, 142c, 142d, 142e may have doping concentration that are greater than its horizontally-preceding channel region 142 by a similar or identical amount. In such an implementation, the difference in dopant concentration between channel region 142a and channel region 142d may be approximately equal to the difference in doping concentration between channel region 142d and channel region 142b. As with other examples discussed herein, each transistor 150a, 150b, 150c, 150d, 150e may be coupled to one shared gate node (e.g., one of nodes G1, G2, G3, G4) shown in FIG. 1 through contacts, wires, etc., that are located in front of, or behind, the plane of the page. Each gate structure 152, additionally, may have a substantially uniform gate length along the X-axis and in some cases may have approximately uniform gate insulator 154 thicknesses.

An input node may be coupled to an output node through transistors 150 of FET stack 110. Due to the non-uniform conductive doping in each channel region 142a, 142b, 142c, 142d, 142e, the source-drain voltage of each successive transistor will increase as current travels from the input to the output of FET stack 110. In high power applications, the greater amounts of conductive doping in second transistor 150b and will compensate for losses from capacitive coupling in other transistors (e.g., transistor 150a) of FET stack 110. In some cases, each transistor 150a, 150b, 150c, 150d, 150e of FET stack 110 may have a unique threshold voltage.

Embodiments of the disclosure provide several technical and commercial advantages. Embodiments of FET stack 110 may be particularly effective in cases where large numbers of transistors are required. For example, embodiments of FET stack 110 (FIGS. 1, 3, 7) prevent significant voltage losses and/or operational inconsistencies from occurring in high voltage applications. These advantages arise from varying the threshold voltage of successive transistors in a single stack, such that transistors closest to the output node have higher threshold voltages than transistors closest to the input node. Additionally, FET stacks 110 according to the disclosure can be formed by changing the structure of photoresist layer 120 (FIGS. 3, 5) from its conventional layout, but otherwise manufacturing FET stack 110 substantially as in conventional processing to form transistors.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A field effect transistor (FET) stack, comprising:
    a first transistor over a substrate, the first transistor including:
        a first active semiconductor material including a first channel region between a first set of source/drain terminals, and
        a first gate structure over the first channel region, wherein the first gate structure includes a first gate insulator of a first thickness above the first channel region;
    a second transistor over the substrate and horizontally separated from the first transistor, the second transistor including:
        a second active semiconductor material including a second channel region between a second set of source/drain terminals, wherein a selected one of the set of second source/drain terminals is coupled to a selected one of the first set of source/drain terminals of the first transistor, and
        a second gate structure over the second channel region, wherein the second gate structure includes a second gate insulator of a second thickness above the second channel region, the second thickness being greater than the first thickness;
    a shared gate node coupled to each of the first gate structure and the second gate structure,
    at least one trench isolation on the substrate between the first active semiconductor material and the second active semiconductor material;
    and
    a buried insulator layer directly beneath each of the first active semiconductor material and the second active semiconductor material.

2. The FET stack of claim 1, further comprising a third transistor over the substrate and horizontally between the first transistor and the second transistor, the third transistor including:
    a third active semiconductor material including a third channel region between a third set of source/drain terminals, wherein the selected one of the first set of source/drain terminals is coupled to the selected one of the second set of source/drain terminals through the third set of source/drain terminals; and
    a third gate structure over the third channel region, wherein the third gate structure includes a third gate insulator of a third thickness above the third channel region, wherein the third thickness is greater than the first thickness and less than the second thickness.

3. The FET stack of claim 2, wherein a difference between the first thickness and the second thickness is approximately equal to a difference between the second thickness and the third thickness.

4. The FET stack of claim 1, wherein a gate length of the first gate structure is approximately equal to a gate length of the second gate structure.

5. The FET stack of claim 1, wherein the first active semiconductor material and the second active semiconductor material are each doped with the same dopant, and wherein the second active semiconductor material has a lower dopant nitrogen concentration than the first active semiconductor material.

6. The FET stack of claim 1, wherein the second thickness of the second gate insulator is sized to cause a threshold voltage of the second transistor to be greater than a threshold voltage of the first transistor.

7. The FET stack of claim 1, wherein the FET stack comprises one of a series FET stack or a shunt FET stack within an radio frequency (RF) switching circuit.

8. A field effect transistor (FET) stack, comprising:
    a first transistor over a substrate, the first transistor including:
        a first active semiconductor material including a first channel region between a first set of source/drain terminals, and
        a first gate structure over the first channel region, wherein the first gate structure includes a first gate insulator of a first thickness above the first channel region;
    a second transistor over the substrate and horizontally separated from the first transistor, the second transistor including:
        a second active semiconductor material including a second channel region between a second set of source/drain terminals, wherein a selected one of the set of second source/drain terminals is coupled to a selected one of the first set of source/drain terminals of the first transistor, and
        a second gate structure over the second channel region, wherein the second gate structure includes a second gate insulator of a second thickness above the second channel region, the second thickness being greater than the first thickness; and
    a shared gate node coupled to each of the first gate structure and the second gate structure,
    wherein the first active semiconductor material and the second active semiconductor material are each doped with the same dopant, and wherein the second active semiconductor material has a lower dopant concentration than the first active semiconductor material.

9. The FET stack of claim 8, further comprising a third transistor over the substrate and horizontally between the first transistor and the second transistor, the third transistor including:
 a third active semiconductor material including a third channel region between a third set of source/drain terminals, wherein the selected one of the first set of source/drain terminals is coupled to the selected one of the second set of source/drain terminals through the third set of source/drain terminals; and
 a third gate structure over the third channel region, wherein the third gate structure includes a third gate insulator of a third thickness above the third channel region, wherein the third thickness is greater than the first thickness and less than the second thickness.

10. The FET stack of claim 9, wherein a difference between the first thickness and the second thickness is approximately equal to a difference between the second thickness and the third thickness.

11. The FET stack of claim 8, wherein a gate length of the first gate structure is approximately equal to a gate length of the second gate structure.

12. The FET stack of claim 8, wherein the second thickness of the second gate insulator is sized to cause a threshold voltage of the second transistor to be greater than a threshold voltage of the first transistor.

13. The FET stack of claim 8, wherein the FET stack comprises one of a series FET stack or a shunt FET stack within an radio frequency (RF) switching circuit.

14. A field effect transistor (FET) stack, comprising:
 a first transistor including:
  a first active semiconductor material including a first channel region between a first set of source/drain terminals, and
  a first gate structure over the first channel region, wherein the first gate structure includes a first gate insulator of a first thickness above the first channel region;
 a second transistor including:
  a second active semiconductor material including a second channel region between a second set of source/drain terminals, wherein a selected one of the set of second source/drain terminals is coupled to a selected one of the first set of source/drain terminals of the first transistor, and
  a second gate structure over the second channel region, wherein the second gate structure includes a second gate insulator of a second thickness above the second channel region, the second thickness being greater than the first thickness;
 a gate node coupled to each of the first gate structure and the second gate structure,
 a trench isolation between the first active semiconductor material and the second active semiconductor material; and
 a buried insulator layer beneath each of the first active semiconductor material and the second active semiconductor material,
 wherein the first active semiconductor material and the second active semiconductor material are each doped with the same dopant, and wherein the second active semiconductor material has a dopant concentration lower than the first active semiconductor material.

15. The FET stack of claim 14, further comprising a third transistor over the and between the first transistor and the second transistor, the third transistor including:
 a third active semiconductor material including a third channel region between a third set of source/drain terminals, wherein the selected one of the first set of source/drain terminals is coupled to the selected one of the second set of source/drain terminals through the third set of source/drain terminals; and
 a third gate structure over the third channel region, wherein the third gate structure includes a third gate insulator of a third thickness above the third channel region, wherein the third thickness is greater than the first thickness and less than the second thickness.

16. The FET stack of claim 15, wherein a difference between the first thickness and the second thickness is approximately equal to a difference between the second thickness and the third thickness.

17. The FET stack of claim 14, wherein a gate length of the first gate structure is approximately equal to a gate length of the second gate structure.

18. The FET stack of claim 14, wherein the second thickness of the second gate insulator is sized to cause a threshold voltage of the second transistor to be greater than a threshold voltage of the first transistor.

19. The FET stack of claim 14, wherein the FET stack comprises one of a series FET stack or a shunt FET stack within an radio frequency (RF) switching circuit.

\* \* \* \* \*